(12) United States Patent
Wang et al.

(10) Patent No.: US 6,316,365 B1
(45) Date of Patent: Nov. 13, 2001

(54) CHEMICAL-MECHANICAL POLISHING METHOD

(75) Inventors: Shumin Wang, Naperville; Homer Chou, Schaumburg, both of IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 09/728,779

(22) Filed: Dec. 1, 2000

Related U.S. Application Data

(60) Provisional application No. 60/169,382, filed on Dec. 7, 1999.

(51) Int. Cl.$^7$ .................. H01L 21/302; H01L 21/461
(52) U.S. Cl. .................. 438/692; 438/618; 438/693
(58) Field of Search ........................... 438/689, 691, 438/692, 722, 735, 748, 618, 623, 637, 661, 690, 693, 697

(56) References Cited

U.S. PATENT DOCUMENTS

| | | | |
|---|---|---|---|
| 5,863,838 | * | 1/1999 | Farkas et al. ............ 438/693 |
| 6,063,306 | * | 5/2000 | Kaufman et al. .......... 252/79.4 |
| 6,077,337 | * | 6/2000 | Lee ........................... 106/3 |

* cited by examiner

*Primary Examiner*—David Nelms
*Assistant Examiner*—Phuc T. Dang

(57) ABSTRACT

The present invention provides a method for chemically-mechanically polishing a substrate comprising tantalum and a conductive metal (other than tantalum). The method comprises (a) applying to the substrate a conductive metal-selective polishing composition and a metal oxide abrasive, (b) selectively removing at least a portion of the conductive metal as compared to the tantalum from the substrate, (c) applying to the substrate a tantalum-selective polishing composition and a metal oxide abrasive, and (d) removing at least a portion of the tantalum as compared to the conductive metal from the substrate. In one embodiment, the conductive metal-selective polishing composition is any such polishing composition, and the tantalum-selective polishing composition comprises a persulfate compound and a passivation film-forming agent for the conductive metal. In another embodiment, the conductive metal-selective polishing composition comprises a persulfate compound and optionally a passivation film-forming agent for the conductive metal, and the conductive metal-selective polishing composition or the polishing process is adjusted to render the conductive metal-selective polishing composition a tantalum-selective polishing composition, such as described above.

24 Claims, No Drawings

CHEMICAL-MECHANICAL POLISHING METHOD

CROSS-REFERENCE TO RELATED PATENT APPLICATIONS

This patent application claims the benefit of U.S. provisional patent application 60/169,382, filed Dec. 7, 1999.

TECHNICAL FIELD OF THE INVENTION

The present invention relates to a method of planarizing or polishing a surface comprising tantalum and a conductive metal, such as the surface of a semiconductor.

BACKGROUND OF THE INVENTION

Integrated circuits are made up of millions of active devices formed in or on a silicon substrate. The active devices, which are initially isolated from one another, are interconnected to form functional circuits and components. The devices are interconnected through the use of well-known multilevel interconnections.

Interconnection structures normally have a first layer of metallization, an interconnection layer, a second level of metallization, and sometimes a third and subsequent level of metallization. Interlevel dielectrics, such as doped and undoped silicon dioxide ($SiO_2$), are used to electrically isolate the different levels of metallization in a silicon substrate or well.

The electrical connections between different interconnection levels are made through the use of metallized vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts may be filled with various metals and alloys (hereinafter referred to as "conductive metals"), such as titanium (Ti), titanium nitride (TiN), aluminum copper (Al—Cu), aluminum silicon (Al—Si), copper (Cu), tungsten (W), noble metals (e.g., iridium (Ir), ruthenium (Ru), gold (Au), and platinum (Pt)), and combinations thereof.

The metal vias and contacts generally employ an adhesion layer (hereinafter referred to as a "barrier film"), such as a titanium (Ti), titanium nitride (TiN), tantalum (Ta), or tantalum nitride (TaN) barrier film, to adhere the metal layer to the $SiO_2$ substrate. At the contact level, the barrier film acts as a diffusion barrier to prevent the conductive metal and $SiO_2$ from reacting.

In one semiconductor manufacturing process, metallized vias or contacts are formed by a blanket metal deposition followed by a chemical-mechanical polish (CMP) step. In a typical process, via holes are etched through an interlevel dielectric (ILD) to interconnection lines or to a semiconductor substrate. Next, a barrier film is formed over the ILD and is directed into the etched via hole. Then, a metal film is blanket-deposited over the barrier film and into the via hole. Deposition is continued until the via hole is filled with the blanket-deposited metal. Finally, the excess metal is removed by chemical-mechanical polishing (CMP) to form metal vias. Processes for manufacturing and/or CMP of vias are disclosed in U.S. Pat. Nos. 4,671,851, 4,910,155, and 4,944,836.

In a typical chemical-mechanical polishing process, the substrate to be polished is placed in direct contact with a rotating polishing pad. During the polishing process, the pad and substrate are rotated while a downward force is maintained on the substrate against the pad by a carrier. An abrasive and chemically reactive solution, commonly referred to as a "slurry," is applied to the pad during polishing. The slurry initiates the polishing process by chemically reacting with the substrate being polished, and the abrasive acts to mechanically polish the substrate. While the abrasive typically is in the slurry, the abrasive also can be fixed on the polishing pad. The polishing process is facilitated by the rotational movement of the pad relative to the substrate (i.e., plate speed) and/or the movement of the substrate relative to the pad (i.e., carrier speed), as a polishing composition is provided to the pad/substrate interface. Polishing is continued in this manner until the desired material on the substrate is removed.

The polishing composition is an important factor in the CMP process. Depending on the choice of the oxidizing agent, the abrasive, and other useful additives, the polishing composition can be tailored to provide effective polishing to metal layers at desired polishing rates while minimizing surface imperfections, defects, corrosion, and erosion. Furthermore, the polishing composition can be used to provide controlled polishing selectivities to specific materials used in integrated circuit technology. Accordingly, the polishing efficiency of particular polishing compositions is dependent upon the composition, as well as the chemical nature of the component metals in the vias (i.e., conductive metals) and the barrier films.

Barrier films of titanium, titanium nitride, and like metals, such as tungsten, are chemically active in general. Thus, such barrier films are similar in chemical nature to typical conductive metals, such as copper. Consequently, a single polishing composition can be used effectively to polish both Ti/TiN barrier films and Cu conductive metals at similar rates. Such polishing compositions typically contain an abrasive material, such as silica or alumina, suspended in an aqueous medium with an oxidizing agent, a film-forming agent, and/or other components. See, e.g., U.S. Pat. Nos. 5,726,099, 5,783,489, 5,858,813, and 5,954,997.

Tantalum barrier films, however, are significantly different from Ti, TiN, and like barrier films. Tantalum (Ta) and tantalum nitride (TaN) are relatively inert in chemical nature as compared to Ti and TiN. Accordingly, the aforementioned polishing compositions are significantly less effective at polishing tantalum layers than they are at polishing titanium layers (i.e., the tantalum removal rate is significantly lower than the titanium removal rate). While conductive metals and titanium are conventionally polished with a single composition due to their similarly high removal rates, joint polishing of conductive metals and tantalum results in undesirable effects such as oxide erosion and conductive metal dishing. These undesirable effects are due to the significantly higher removal rate of typical conductive metals than of tantalum during the polishing process with the aforementioned polishing compositions.

Consequently, there remains a need for a method of chemically-mechanically polishing a substrate comprising tantalum and a conductive metal (e.g., copper) in a manner such that planarization efficiency, uniformity, and removal rate are maximized and undesirable effects, such as surface imperfections and damage to underlying topography, are minimized. The present invention provides such a method. These and other characteristics and advantages of the present invention will be apparent from the description of the invention provided herein.

BRIEF SUMMARY OF THE INVENTION

The present invention provides a method of chemically-mechanically polishing a substrate comprising tantalum and a conductive metal, wherein the method comprises (a) applying to the substrate a conductive metal-selective polishing composition and a metal oxide abrasive, (b) selectively removing at least a portion of the conductive metal as compared to the tantalum from the substrate, (c) applying to the substrate (i) a tantalum-selective polishing composition comprising a persulfate compound and a passivation film-forming agent for the conductive metal and (ii) a metal oxide abrasive, and (d) selectively removing at least a portion of the tantalum as compared to the conductive metal from the substrate.

The present invention also provides a method for chemically-mechanically polishing a substrate comprising tantalum and a conductive metal, wherein the method comprises (a) applying to the substrate (i) a conductive metal-selective polishing composition comprising a persulfate compound and optionally a passivation film-forming agent for the conductive metal, wherein the conductive-metal-selective polishing composition has a certain pH, and (ii) a metal oxide abrasive, and (b) selectively removing at least a portion of the conductive metal as compared to the tantalum from the substrate, (c) adjusting the conductive metal-selective polishing composition or the polishing process to render the conductive metal-selective polishing composition a tantalum-selective polishing composition, and (d) selectively removing at least a portion of the tantalum as compared to the conductive metal from the substrate.

DESCRIPTION OF THE PREFERRED EMBODIMENTS

The present invention provides a method for chemically-mechanically polishing a substrate comprising tantalum and a conductive metal (other than tantalum). The method comprises (a) applying to the substrate a conductive metal-selective polishing composition and a metal oxide abrasive, (b) selectively removing at least a portion of the conductive metal as compared to the tantalum from the substrate, (c) applying to the substrate (i) a tantalum-selective polishing composition and (ii) a metal oxide abrasive, and (d) removing at least a portion of the tantalum as compared to the conductive metal from the substrate.

In one embodiment, the conductive metal-selective polishing composition is any such polishing composition, and the tantalum-selective polishing composition comprises a persulfate compound and a passivation film-forming agent for the conductive metal. In another embodiment, the conductive metal-selective polishing composition comprises a persulfate compound and optionally a passivation film-forming agent for the conductive metal, wherein the conductive metal-selective polishing composition has a certain pH, and the conductive metal-selective polishing composition or the polishing process is adjusted to render the conductive metal-selective polishing composition a tantalum-selective polishing composition, such as described above.

The term "conductive metal-selective" refers to the preferential removal of the conductive metal relative to the tantalum from a substrate, e.g., a conductive metal: tantalum removal rate ratio of greater than 1. Similarly, the term "tantalum-selective" refers to the preferential removal of the tantalum relative to the conductive metal from a substrate, e.g., a conductive metal:tantalum removal rate ratio of less than 1. The term "tantalum" refers to tantalum itself, as well as tantalum-containing compounds. Thus, the tantalum can be in the form of, for example, tantalum metal or tantalum nitride.

It is desirable in some instances to transform the conductive metal-selective polishing composition to a tantalum-selective polishing composition in situ, e.g., during the polishing process. This can be accomplished in any suitable manner. The conductive metal-selective polishing composition can be adjusted to provide a tantalum-selective polishing composition, for example, by increasing the pH of the polishing composition, by adding additional components and/or altering existing components (e.g., in terms of reactions or concentrations) of the polishing composition, by increasing the concentration of the passivation film-forming agent for the conductive metal in the polishing composition (which includes adding a passivation film-forming agent if one is not already present), or any combination thereof. Alternatively, or in addition, the polishing process can be adjusted to render the conductive metal-selective polishing composition a tantalum-selective polishing composition, for example, by decreasing polishing aggressiveness. Polishing aggressiveness can be decreased by decreasing the pressure with which the pad and substrate contact each other, decreasing the carrier speed of the substrate during contact with the pad, decreasing the platen speed of the pad during contact with the substrate, or any combination thereof.

Depending on the particular embodiment of the present invention, the conductive metal-selective and tantalum-selective polishing compositions can have some components that are the same or can have all different components. To the extent the conductive metal-selective and tantalum-selective polishing compositions have the same components, those components can be present in the same or different concentrations.

The conductive metal can be any suitable conductive metal. Suitable conductive metals include, for example, copper, aluminum, aluminum silicon, titanium, titanium nitride, tungsten, tungsten nitride, gold, platinum, iridium, ruthenium, and alloys and combinations thereof. Preferably, the conductive metal is copper.

The metal oxide abrasive can be any suitable metal oxide. Suitable metal oxides include alumina, silica, titania, ceria, zirconia, germania, magnesia, and combinations thereof. Preferably, the metal oxide abrasive is silica. More preferably, the metal oxide abrasive is fumed silica.

Any suitable amount of the metal oxide abrasive can be used in the context of the present invention. The metal oxide abrasive desirably is present in the conductive metal-selective and tantalum-selective polishing compositions, for example, in a concentration of about 2–30 wt. % (e.g., about 2–20 wt. %). Preferably, the metal oxide abrasive is present in the conductive metal-selective and tantalum-selective polishing compositions in a concentration of about 2–15 wt. %, e.g., 2–12 wt. %. More preferably, the metal oxide abrasive is present in the conductive metal-selective and tantalum-selective polishing compositions in a concentration of about 2–10 wt. %. Alternatively, the metal oxide abrasive, in whole or in part, can be present (e.g., fixed) on the polishing pad.

The persulfate compound can be any suitable persulfate compound. Suitable persulfate compounds include, for example, peroxymonosulfate acids, peroxydisulfate acids, and salts thereof. Preferably, the persulfate compound is ammonium peroxydisulfate.

Any suitable amount of the persulfate compound can be used in the context of the present invention. The persulfate compound desirably is present in the conductive metal-selective and tantalum-selective polishing compositions in a concentration of about 0.1–5 wt. %, e.g., about 0.1–4 wt. %.

Preferably, the persulfate compound is present in the conductive metal-selective and tantalum-selective polishing compositions in a concentration of about 0.1–3 wt. %. More preferably, the persulfate compound is present in the conductive metal-selective and tantalum-selective polishing compositions in a concentration of about 0.1–2 wt. %.

The passivation film-forming agent for the conductive metal can be any suitable passivation film-forming agent for conductive metals. Suitable passivation film-forming agents for the conductive metal include, for example, heterocyclic organic compounds. Preferably, the passivation film-forming agent for the conductive metal is a heterocyclic organic compound with at least one 5- or 6-member heterocycle ring as the active functional group, wherein the heterocycle ring contains at least one nitrogen atom. More preferably, the passivation film-forming agent for the conductive metal is benzotriazole, triazole, benzimidazole, or a mixture thereof. Most preferably, the passivation film-forming agent for the conductive metal is benzotriazole.

Any suitable amount of the passivation film-forming agent for the conductive metal can be present in the conductive metal-selective polishing composition and the tantalum-selective polishing composition. The presence of the passivation film-forming agent is optional in the conductive metal-selective polishing composition.

With respect to the conductive metal-selective polishing composition, when the passivation film-forming agent for the conductive metal is present in the conductive metal-selective polishing composition, it desirably is present in a concentration of about 0.001–1 wt. %. Preferably, the passivation film-forming agent for the conductive metal is present in the conductive metal-selective polishing composition in a concentration of about 0.001–0.75 wt. %, e.g., 0.001–0.5 wt. %. More preferably, the passivation film-forming agent for the conductive metal is present in the conductive metal-selective polishing composition in a concentration of about 0.01–0.3 wt. %.

With respect to the tantalum-selective polishing composition, the passivation film-forming agent for the conductive metal preferably is present in the tantalum-selective polishing composition in a concentration of about 0.1–1 wt. %, e.g., about 0.3–0.9 wt. %. More preferably, the passivation film-forming agent for the conductive metal is present in the tantalum-selective polishing composition in a concentration of about 0.4–0.8 wt. %. Most preferably, the passivation film-forming agent for the conductive metal is present in the tantalum-selective polishing composition in a concentration of about 0.5–0.7 wt. %.

The conductive metal-selective polishing composition desirably has a pH of about 3–9. Preferably, the conductive metal-selective polishing composition has a pH of about 4–7, e.g., about 4–6 or about 4–5. The tantalum-selective polishing composition desirably has a pH of about 3–11. Preferably, the tantalum-selective polishing composition has a pH of about 5–11, e.g., about 6–9 or about 7–8. The pH of the conductive metal-selective polishing composition can be adjusted to render the conductive metal-selective polishing composition a tantalum-selective polishing composition with any suitable pH adjuster. Suitable pH adjusters include, for example, bases such as potassium hydroxide, ammonium hydroxide, sodium carbonate, and mixtures thereof, as well as acids such as mineral acids (e.g., nitric acid and sulfuric acid) and organic acids (e.g., acetic acid, citric acid, malonic acid, succinic acid, tartaric acid, and oxalic acid).

The conductive metal-selective and tantalum-selective polishing compositions can optionally further comprise polyacrylamide or polyurethane diol. Any suitable amount of polyacrylamide or polyurethane diol can be present in the conductive metal-selective and tantalum-selective polishing compositions. Preferably, the polyacrylamide or polyurethane diol is present in the conductive metal-selective and tantalum-selective polishing compositions in a concentration of about 0.05–2 wt. %. More preferably, the polyacrylamide or polyurethane diol is present in the conductive metal-selective and tantalum-selective polishing compositions in a concentration of about 0.05–1.5 wt. %, e.g., 0.05–1 wt. %. Most preferably, the polyacrylamide or polyurethane diol is present in the conductive metal-selective and tantalum-selective polishing compositions in a concentration of about 0.1–0.5 wt. %.

The conductive metal-selective and tantalum-selective polishing compositions optionally can further comprise one or more other additives. Such additives include surfactants (e.g., cationic surfactants, anionic surfactants, nonionic surfactants, amphoteric surfactants, fluorinated surfactants, and mixtures thereof), polymeric stabilizers or other surface active dispersing agents (e.g., phosphoric acid, organic acids, tin oxides, and phosphonate compounds), pH buffers (e.g., potassium phosphate), and polishing accelerators such as catalysts, oxidizers, and chelating or complexing agents (e.g., metal, particularly ferric, nitrates, sulfates, halides (including fluorides, chlorides, bromides, and iodides), compounds with carboxylate, hydroxyl, sulfonic, and/or phosphonic groups, di-, tri-, multi-, and poly-carboxylic acids and salts (such as tartaric acid and tartrates, malic acid and malates, malonic acid and malonates, gluconic acid and gluconates, citric acid and citrates, phthalic acid and phthalates, pyrocatecol, pyrogallol, gallic acid and gallates, and tannic acid and tannates), amine-containing compounds (such as primary, secondary, tertiary, and quaternary amines and amino acids), peroxides, periodic acid and salts, perbromic acid and salts, perchloric acid and salts, perboric acid and salts, iodic acid and salts, permaganates, potassium ferricyanide, chlorates, percarbonates, bromates, chromates, cerium compounds, and mixtures thereof).

Any suitable carrier (e.g., solvent) can be used in the conductive metal-selective and tantalum-selective polishing compositions. A carrier is used to facilitate the application of the metal oxide abrasive (if not fixed or otherwise present on the polishing pad), persulfate compound, passivation film-forming agent for the conductive metal, and other components onto the surface of a suitable substrate. A preferred carrier is water.

The conductive metal-selective and tantalum-selective polishing compositions typically also will remove base material (i.e., material other than the tantalum and conductive metal) of the substrate when used to chemically-mechanically polish a substrate comprising tantalum and a conductive metal other than tantalum as described herein. The substrate base material generally will be silica (i.e., silicon dioxide or $SiO_2$). The conductive metal-selective and tantalum-selective polishing compositions and/or the polishing process desirably are adjusted to provide a desired substrate base material removal rate, particularly relative to the conductive metal and tantalum removal rates. The control of the pH of the polishing compositions and/or the control of the concentration of the metal oxide abrasive in the polishing compositions are preferable manners of obtaining desired substrate base material removal rates.

The polishing composition can be provided in a single package, with the metal oxide abrasive being in the package or fixed on the polishing pad, or in two or more packages. It is preferred that each of the conductive metal-selective and tantalum-selective polishing compositions of the present invention is supplied in at least a two package system, where the first package comprises the metal oxide abrasive and the second package comprises the persulfate compound. The remaining components can be placed in either the first container, the second container, or in a third container. Prior to the polishing process, the various packages are combined to form the conductive metal-selective polishing composition and/or tantalum-selective polishing composition.

The following examples further illustrate the present invention but, of course, should not be construed as in any way limiting its scope.

EXAMPLE 1

This example illustrates the adjustment of the concentration of the passivation film-forming agent for the conductive metal in the method of the present invention to render the conductive metal-selective polishing composition a tantalum-selective polishing composition.

Similar substrates of tantalum, copper, and silicon dioxide were polished with five different polishing compositions comprising 6 wt. % fumed silica, 1 wt. % ammonium peroxydisulfate, 0.25 wt. % polyacrylamide, and varying concentrations of benzotriazole (BTA) (i.e., 0.65 wt. %, 0.45 wt. %, 0.30 wt. %, 0.20 wt. %, and 0.10 wt. %), wherein each of the polishing compositions had a pH of 7. The substrates were subjected to a polishing process on a Mirra® platen (Applied Materials), such that there was a downforce (DF) of 2 psi [13.8 kPa], a carrier speed (CS) of 97 rpm, and a platen speed (PS) of 103 rpm. An IC1000 (Rodel) polishing pad was used for each substrate. Following the use of the polishing compositions, the removal rates (RR) of copper, tantalum, and silicon dioxide were determined for each composition, and the ratio of the copper removal rate to the tantalum removal rate (i.e., Cu:Ta RR) was calculated, with the resulting data set forth in Table 1.

TABLE 1

| Composition | Concentration of BTA (wt. %) | Cu RR (Å/min) | Ta RR (Å/min) | Cu:Ta RR | SiO$_2$ RR (Å/min) |
| --- | --- | --- | --- | --- | --- |
| 1A | 0.65 | 202 | 1010 | 0.20 | 44 |
| 1B | 0.45 | 181 | 920 | 0.12 | 35 |
| 1C | 0.30 | 2592 | 860 | 3.01 | 94 |
| 1D | 0.20 | 3407 | 920 | 3.70 | 35 |
| 1E | 0.10 | 5465 | 860 | 6.35 | 94 |

As is apparent from the data set forth in Table 1, the ratio of the copper removal rate to the tantalum removal rate exhibited by the polishing compositions with 0.10–0.30 wt. % BTA (Compositions 1C–1E) was significantly higher than the ratio of the copper removal rate to tantalum removal rate exhibited by the polishing compositions with 0.45–0.65 wt. % BTA (Compositions 1A and 1B). In other words, the increased BTA concentrations inhibited copper removal and made the polishing composition tantalum-selective as opposed to copper-selective, without substantially affecting the silicon dioxide removal rate. These results demonstrate that the conductive metal-selective and tantalum-selective nature of the polishing composition can be controlled by changing the concentration of the passivation film-forming agent for the conductive metal in the polishing composition.

EXAMPLE 2

This example illustrates the adjustment of the pH in the method of the present invention to render the conductive metal-selective polishing composition a tantalum-selective polishing composition.

Similar substrates of tantalum, copper, and silicon dioxide were polished with four different polishing compositions comprising 6 wt. % fumed silica, 1 wt. % ammonium peroxydisulfate, 0.1 wt. % benzotriazole, and 0.25 wt. % polyacrylamide, with varying pH values (i.e., 6.4, 7.0, 7.2, and 8.0). The substrates were subjected to a polishing process on a Mirra® platen (Applied Materials), such that there was a downforce (DF) of 2 psi [13.8 kPa], a carrier speed (CS) of 97 rpm, and a platen speed (PS) of 103 rpm. An IC1000 (Rodel) polishing pad was used for each substrate. Following the use of the polishing compositions, the removal rates (RR) of copper, tantalum, and silicon dioxide were determined for each composition, and the ratio of the copper removal rate to the tantalum removal rate (i.e., Cu:Ta RR) was calculated, with the resulting data set forth in Table 2.

TABLE 2

| Composition | pH | Cu RR (Å/min) | Ta RR (Å/min) | Cu:Ta RR | SiO$_2$ RR (Å/min) |
| --- | --- | --- | --- | --- | --- |
| 2A | 6.4 | 5686 | 987 | 5.76 | 113 |
| 2B | 7.0 | 5656 | 983 | 5.75 | 103 |
| 2C | 7.2 | 119 | 576 | 0.21 | 191 |
| 2D | 8.0 | 124 | 623 | 0.20 | 689 |

As is apparent from the data set forth in Table 2, the ratio of the copper removal rate to the tantalum removal rate exhibited by the polishing compositions with pH values of 6.4–7.0 (Compositions 2A and 2B) was significantly higher than the ratio of the copper removal rate to tantalum removal rate exhibited by the polishing compositions with pH values of 7.2–8.0 (Compositions 2C and 2D). In other words, the increased pH inhibited copper removal and made the polishing composition tantalum-selective as opposed to copper-selective, and also significantly increased the silicon dioxide removal rate. These results demonstrate that the conductive metal-selective and tantalum-selective nature of the polishing composition, as well as the effect on the substrate base material, can be controlled by changing the pH of the polishing composition.

EXAMPLE 3

This example illustrates the adjustment of polishing aggressiveness in the method of the present invention to render the conductive metal-selective polishing composition a tantalum-selective polishing composition.

Similar substrates of tantalum, copper, and silicon dioxide are polished with the same polishing composition comprising 6 wt. % fumed silica, 1 wt. % ammonium peroxydisulfate, 0.1 wt. % benzotriazole, and 0.25 wt. % polyacrylamide, wherein the polishing composition has a pH of 7.85. The substrates are subjected to different polishing processes on a Mirra® platen (Applied Materials), by altering the downforce (DF), backpressure (BP), and platen speed (PS). An IC1000 (Rodel) polishing pad is used for each substrate. Following the use of the polishing composition, the removal rates (RR) of copper, tantalum, and silicon dioxide are determined for each set of polishing conditions, and the ratio of the copper removal rate to the tantalum removal rate (i.e., Cu:Ta RR) is calculated, with the resulting data set forth in Table 3.

TABLE 3

| Composition | Polishing Aggressiveness | | | Cu RR (Å/min) | Ta RR (Å/min) | Cu:Ta RR | SiO₂ RR (Å/min) |
|---|---|---|---|---|---|---|---|
| | DF (psi) [kPa] | BP (psi) [kPa] | PS (rpm) | | | | |
| 3A | 2.5 [17.2] | 2 [13.8] | 143 | 200 | 500 | 0.40 | 300 |
| 3B | 4.5 [31.0] | 4 [27.6] | 43 | 250 | 600 | 0.42 | 300 |
| 3C | 4.0 [27.6] | 3 [20.7] | 93 | 200 | 700 | 0.29 | 400 |
| 3D | 2.5 [17.2] | 2 [13.8] | 43 | 150 | 300 | 0.50 | 150 |
| 3E | 4.5 [31.0] | 4 [27.6] | 143 | 6500 | 900 | 7.22 | 350 |

As is apparent from the data set forth in Table 3, the ratio of the copper removal rate to the tantalum removal rate exhibited by the polishing compositions is significantly affected by the polishing aggressiveness used in each polishing process. In particular, the decreased polishing aggressiveness results in less copper removal (Compositions 3A–3D) relative to tantalum removal (Composition 3E) and makes the polishing composition tantalum-selective as opposed to copper-selective, without substantially affecting the silicon dioxide removal rate, although the polishing aggressiveness can be used to somewhat control the silicon dioxide removal rate (cf. Composition 3D with Compositions 3A–3C and 3E). These results demonstrate that the conductive metal-selective and tantalum-selective nature of the polishing composition, as well as the substrate base material removal rate, can be controlled by changing the polishing process involving the polishing composition.

EXAMPLE 4

This example illustrates that the concentration of metal oxide abrasive in the polishing composition does not significantly affect the ratio of the conductive metal removal rate to the tantalum removal rate exhibited by the polishing composition.

Similar substrates of tantalum, copper, and silicon dioxide were polished with four different polishing compositions comprising 1 wt. % ammonium peroxydisulfate, 0.2 wt. % benzotriazole, 0.25 wt. % polyacrylamide, and varying concentrations of fumed silica (i.e., 15 wt. %, 12 wt. %, 6 wt. %, and 3 wt. %), wherein each of the polishing compositions had a pH of 7. The substrates were subjected to a polishing process on an IPEC 472 platen, such that there was a downforce (DF) of 3 psi [20.7 kPa], a carrier speed (CS) of 93 rpm, and a platen speed (PS) of 87 rpm. An IC1000 (Rodel) polishing pad was used for each substrate. Following the use of the polishing compositions, the removal rates (RR) of copper, tantalum, and silicon dioxide were determined for each composition, and the ratio of the copper removal rate to the tantalum removal rate (i.e., Cu:Ta RR) was calculated, with the resulting data set forth in Table 4.

TABLE 4

| Composition | Wt. % Abrasive | Cu RR (Å/min) | Ta RR (Å/min) | Cu:Ta RR | SiO₂ RR (Å/min) |
|---|---|---|---|---|---|
| 4A | 15 | 133 | 760 | 0.18 | 519 |
| 4B | 12 | 187 | 763 | 0.24 | 484 |
| 4C | 6 | 145 | 602 | 0.24 | 208 |
| 4D | 3 | 153 | 610 | 0.25 | 106 |

As is apparent from the data set forth in Table 4, the ratio of the copper removal rate to the tantalum removal rate exhibited by the polishing composition with 3 wt. % fumed silica (Composition 4D) was not significantly different from the ratio of the copper removal rate to the tantalum removal rate exhibited by the polishing compositions with 6–12 wt. % fumed silica (Compositions 4B and 4C), while the Cu:Ta removal rate ratio was slightly lower for the polishing composition with 15 wt. % fumed silica (Composition 4A). These results demonstrate that the concentration of metal oxide abrasive in the polishing composition does not significantly affect the selectivity of the composition for removing conductive metals versus tantalum. As demonstrated by these results, however, the metal oxide abrasive concentration does significantly affect the silicon dioxide removal rate, which allows for the present inventive method to be fine-tuned with respect to conductive metal, tantalum, and substrate base material removal rates.

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defined by the following claims.

What is claimed is:

1. A method of chemically-mechanically polishing a substrate comprising tantalum and a conductive metal other than tantalum, wherein the method comprises:
    (a) applying to the substrate (i) a conductive metal-selective polishing composition comprising a persulfate compound and optionally a passivation film-forming agent for the conductive metal, wherein the conductive metal-selective polishing composition has a certain pH, and (ii) a metal oxide abrasive,
    (b) selectively removing at least a portion of the conductive metal as compared to the tantalum from the substrate,
    (c) adjusting the conductive metal-selective polishing composition or the polishing process to render the conductive metal-selective polishing composition a tantalum-selective polishing composition, and
    (d) selectively removing at least a portion of the tantalum as compared to the conductive metal from the substrate.

2. The method of claim 1, wherein the tantalum is in the form of tantalum metal or tantalum nitride.

3. The method of claim 1, wherein the conductive metal is selected from the group consisting of copper, aluminum, aluminum silicon, titanium, titanium nitride, tungsten, tungsten nitride, gold, platinum, iridium, ruthenium, and alloys and combinations thereof.

4. The method of claim 3, wherein the conductive metal is copper.

5. The method of claim 1, wherein step (c) comprises increasing the pH of the polishing composition.

6. The method of claim 1, wherein step (c) comprises increasing the concentration of the passivation film-forming agent in the polishing composition.

7. The method of claim 1, wherein step (c) comprises decreasing polishing aggressiveness by decreasing the pressure with which the pad and substrate are contacted, decreasing the carrier speed of the substrate during contact, decreasing the platen speed of the pad during contact, or any combination thereof.

8. The method of claim 1, wherein the metal oxide abrasive is selected from the group consisting of alumina, silica, titania, ceria, zirconia, germania, magnesia, and combinations thereof.

9. The method of claim 8, wherein the metal oxide abrasive is silica.

10. The method of claim 9, wherein the metal oxide abrasive is fumed silica.

11. The method of claim 1, wherein the metal oxide abrasive is in the polishing composition.

12. The method of claim 11, wherein the metal oxide abrasive is present in the conductive metal-selective and tantalum-selective polishing compositions in a concentration of about 2–30 wt. %.

13. The method of claim 1, wherein the metal oxide abrasive is fixed on a polishing pad.

14. The method of claim 1, wherein the persulfate compound is selected from the group consisting of peroxymonosulfate acid, peroxydisulfate acid, and salts thereof.

15. The method of claim 14, wherein the persulfate compound is ammonium peroxydisulfate.

16. The method of claim 1, wherein the persulfate compound is present in the conductive metal-selective and tantalum-selective polishing compositions in a concentration of about 0.1–5 wt. %.

17. The method of claim 1, wherein the passivation film-forming agent is a heterocyclic organic compound.

18. The method of claim 17, wherein the passivation film-forming agent is a heterocyclic organic compound with at least one 5- or 6-member heterocycle ring as the active functional group, wherein the heterocycle ring contains at least one nitrogen atom.

19. The method of claim 18, wherein the passivation film-forming agent is selected from the group consisting of benzotriazole, triazole, benzimidazole, and mixtures thereof.

20. The method of claim 19, wherein the passivation film-forming agent is benzotriazole.

21. The method of claim 1, wherein the passivation film-forming agent is present in the conductive metal-selective polishing composition in a concentration of about 0.001–1 wt. %.

22. The method of claim 1, wherein the passivation film-forming agent is present in the tantalum-selective polishing composition in a concentration of about 0.3–1 wt. %.

23. The method of claim 1, wherein the conductive metal-selective and tantalum-selective polishing compositions further comprise polyacrylamide or polyurethane diol.

24. The method of claim 1, wherein the substrate base material is silicon dioxide.

* * * * *